US006547863B2

(12) United States Patent
Onozawa et al.

(10) Patent No.: US 6,547,863 B2
(45) Date of Patent: Apr. 15, 2003

(54) METAL COMPOUND SOLUTION AND THIN FILM FORMATION USING THE SAME

(75) Inventors: Kazuhisa Onozawa, Tokyo (JP); Naoki Yamada, Tokyo (JP)

(73) Assignee: Asahi Denka Kogyo Kabushiki Kaisha, Tokyo (JP)

( * ) Notice: Subject to any disclaimer, the term of this patent is extended or adjusted under 35 U.S.C. 154(b) by 66 days.

(21) Appl. No.: 09/784,191

(22) Filed: Feb. 16, 2001

(65) Prior Publication Data
US 2001/0022148 A1 Sep. 20, 2001

(30) Foreign Application Priority Data

Feb. 17, 2000 (JP) .......................... 2000-039204

(51) Int. Cl.$^7$ .............................. C23C 16/40; C07F 7/28
(52) U.S. Cl. ............................. 106/1.25; 106/287.19; 556/40; 556/76
(58) Field of Search .................... 106/1.25, 287.19; 556/40, 76

(56) References Cited

U.S. PATENT DOCUMENTS

| | | | | |
|---|---|---|---|---|
| 4,993,361 A | * | 2/1991 | Unvala | .................. 118/715 |
| 5,767,302 A | * | 6/1998 | Ogi et al. | .................. 501/1 |
| 6,117,487 A | * | 9/2000 | Akutsu et al. | .......... 427/255.31 |
| 6,280,518 B1 | * | 8/2001 | Itsuki et al. | ........... 106/287.19 |

FOREIGN PATENT DOCUMENTS

| | | |
|---|---|---|
| JP | 7-076778 | 3/1995 |
| JP | 10-298762 | 11/1998 |

OTHER PUBLICATIONS

Wakiya et al., "Preparation of $PbTiO_3$ Thin Film by Mist Source Plasma Enhanced Chemical Vapor Deposition (CVD) Using Heptane Solvent", Jpn. J. Appl. Phys., vol. 38, pp. 5326–5331, Sep. 1999.

* cited by examiner

*Primary Examiner*—Helene Klemanski
(74) *Attorney, Agent, or Firm*—Young & Thompson

(57) ABSTRACT

A metal compound solution of a metal compound represented by formula (I):

$$\left( \begin{array}{c} R_1 \\ \diagdown \\ \diagup \\ R_2 \end{array} \right)_m \hspace{-0.5em} \begin{array}{c} O \\ \diagdown \\ \diagup \\ O \end{array} \hspace{-0.5em} M \hspace{-0.5em} \begin{array}{c} (O-R_3)_l \\ O \\ \diagup R_4 \\ O \end{array}_n \hspace{2em} (I)$$

wherein $R_1$, $R_2$, and $R_3$ are each a halogen-substituted or unsubstituted alkyl group having 1 to 8 carbon atoms which may contain an oxygen atom in its carbon chain; $R_4$ is a straight-chain or branched alkylene group having 2 to 18 carbon atoms; M is lead, titanium or zirconium: when M is lead, l, m and n represent 0, 2 and 0, respectively; when M is titanium or zirconium, n represents 0 or 1, and l and m each represent an integer of 0 to 4 satisfying equation: $1+m+2n=4$,
in a cyclohexane compound represented by formula (II):

$$\bighexagon (R_5)_p \hspace{2em} (II)$$

wherein $R_5$ represents a hydrogen atom or an alkyl group having 1 to 4 carbon atoms; and p represents 1 or 2.

5 Claims, 2 Drawing Sheets

METAL COMPOUND SOLUTION AND THIN FILM FORMATION USING THE SAME

BACKGROUND OF THE INVENTION

1. Field of the Invention

The present invention relates to a metal compound solution and a process for producing a thin film using the same. More particularly, it relates to a metal compound solution comprising a specific organic solvent which is useful as a raw material of chemical vapor deposition and a process for producing a lead titanate-based thin film using the same.

2. Description of the Related Art

A thin film of a composite metal oxide having controlled composition and structure is expected for application to semiconductors, electronic components, optical materials, and the like. Inter alia, lead titanate-based composite oxides, such as lead titanate (PT), lead zirconate titanate (PZT), and lead lanthanum zirconate titanate (PLZT), exhibit specific electrical characteristics, such as a large specific dielectric constant and ferroelectricity, and have been used in electronic devices, e.g., highly dielectric and/or ferroelectric memory devices.

Processes for making a thin film of the composite metal oxide include sputtering, ion plating, pyrolytic coating, and so forth. Among them chemical vapor deposition (hereinafter "CVD") has been given studies as the most suitable thin film formation technique because of ease of composition control, excellent stop coverage, and adaptability to the semiconductor production processes.

Materials fit for CVD are compounds which can supply a metallic element constituting a desired metal oxide in a vapor phase, i.e., a metal compound that vaporizes stably. Metal compounds which are usually used include alkyl compounds, alkoxide compounds and complexes with β-diketone compounds. Where the metal compound is a solid having a high melting point, a solution CVD technique, in which a solution of the metal compound in an organic solvent is used, has been proposed for securing sufficient supply of the metal source.

In making a lead titanate-based thin film by CVD, solution CVD is adopted because β-diketonatolead complexes that are solid are mostly used.

The organic solvent which can be used in solution CVD includes polar solvents that are highly capable of dissolving metal compounds to produce a stabilizing effect, such as tetrahydrofuran, butyl acetate, and polyethylene glycol dimethyl ether. For example, Japanese Patent Laid-Open Nos. 7-76778 and 10-298762 disclose formation of a lead titanate-based thin film by solution CVD using a tetrahydrofuran solution. Unlike the other metal compounds, however, the β-diketonatolead complexes are liable to form white turbidity or a precipitate in a polar solvent such as tetrahydrofuran, causing disorders in the thin film formation. To address this problem, *Jpn. Appl. Phys.*, vol. 38, pt. 1, No. 9B, pp 5326–5330 (1999) reports production of a lead titanate thin film by solution CVD using a hydrocarbon solvent such as octane. Although these organic solvents do not form white turbidity or a precipitate, they are less capable of dissolving the metal compound, easily causing the dissolved solid material to precipitate out with temperature change or partial volatilization of the solvent or concentration change of the solution, failing to guarantee stability for use.

SUMMARY OF THE INVENTION

An object of the present invention is to provide a metal compound solution having stability and a concentration fit for solution CVD, a CVD material comprising the solution, and a process of producing a thin film using the CVD material.

As a result of extensive investigation, the present inventors have found that the above object is accomplished by a certain kind of cyclohexane compounds which are capable of sufficiently dissolving metal compounds to provide a stable CVD material.

The present invention has been reached based on the above finding. The invention relates to a metal compound solution comprising a metal compound represented by formula (I):

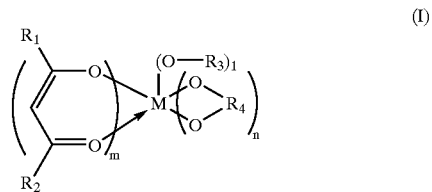

wherein $R_1$, $R_2$, and $R_3$ each represent a halogen-substituted or unsubstituted alkyl group having 1 to 8 carbon atoms which may contain an oxygen atom in its carbon chain; $R_4$ represents a straight-chain or branched alkylene group having 2 to 18 carbon atoms; M represents a lead atom, a titanium atom or a zirconium atom; when M is a lead atom, l, m and n represent 0, 2 and 0, respectively; when M is a titanium atom or a zirconium atom, n represents 0 or 1, and l and m each represent an integer of 0 to 4 satisfying equation: $l+m+2n=4$, the metal compound being dissolved in a cyclohexane compound represented by formula (II):

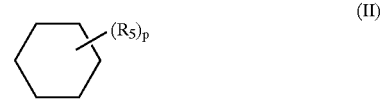

wherein $R_5$ represents a hydrogen atom or an alkyl group having 1 to 4 carbon atoms; and p represents 1 or 2.

The present invention provides a metal compound solution having stability and a concentration fit for solution CVD, a CVD material comprising the solution, and a process of producing a thin film using the CVD material.

BRIEF DESCRIPTION OF THE DRAWINGS

The present invention will be more particularly described with reference to the accompanying drawings, in which.

DETAILED DESCRIPTION OF THE INVENTION

Figure 1:
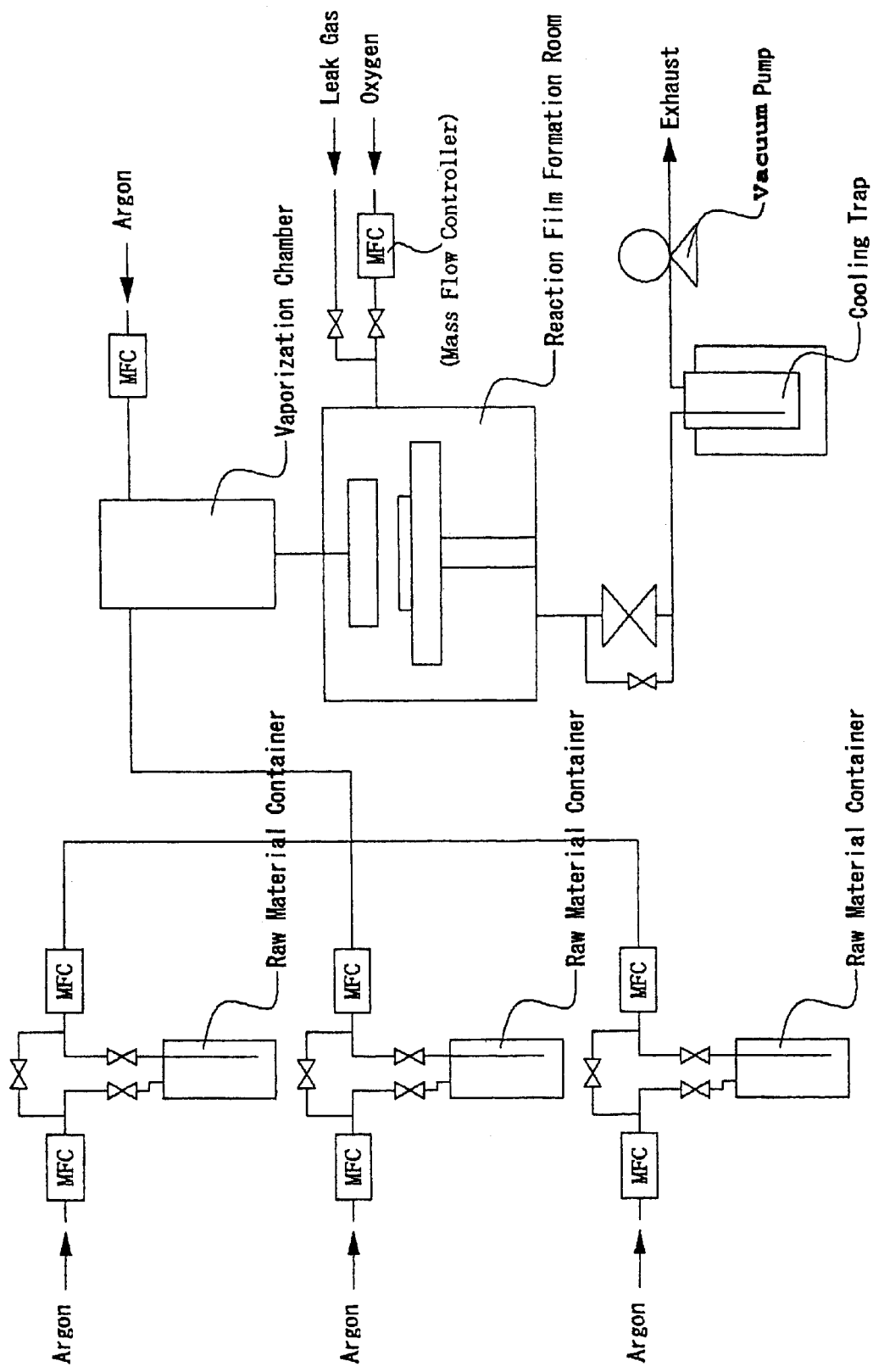
FIG. 1 schematically illustrates an example of a CVD apparatus used in the lead titanate-based thin film formation according to the present invention.

The metal compounds represented by formula (I) have been, or are expected to be, applied as CVD materials. In formula (I), the halogen-substituted or unsubstituted alkyl group having 1 to 8 carbon atoms which may contain an oxygen atom in its carbon chain as represented by $R_1$, $R_2$ and $R_3$ includes methyl, ethyl, propyl, isopropyl, butyl, sec-butyl, t-butyl, isobutyl, amyl, isoamyl, t-amyl, hexyl, 1-ethylpentyl, cyclohexyl, 1-methylcyclohexyl, heptyl, isoheptyl, t-heptyl, n-octyl, isooctyl, t-octyl, 2-ethylhexyl, trifluoromethyl, perfluorohexyl, 2-methoxyethyl, 2-ethoxyethyl, 2-butoxyethyl, 2-(2-methoxyethoxy)ethyl, 1-methoxy-1,1-dimethylmethyl, 2-methoxy-1,1-dimethylethyl, 2-ethoxy-1,1-dimethylethyl, 2-isopropoxy-1,1-dimethylethyl, 2butoxy-1,1-dimethylethyl, and 2-(2-methoxyethoxy)-1,1-dimethylethyl. The straight-chain or branched alkylene group having 2 to 18 carbon atoms as represented by $R_4$ includes residues derived from glycols, such as 1,2-ethanediol, 1,2-propanediol, 1,3-propanediol, 2,4-hexanediol, 2,2-dimethyl-1,3-propanediol, 2,2-diethyl-1,3-propanediol, 2,2-diethyl-1,3-butanediol, 2-ethyl-2-butyl-1,3-propanediol, 2,4-pentanediol, 2-methyl-1,3-propanediol, and 1-methyl-2,4-pentanediol. Residues derived from those diols which can make a 6-membered ring together with the metallic element M or their alkyl derivatives are particularly preferred for stability of the compound (I).

The lead compounds (I) in which M is lead are complexes with a β-ketone compound. Examples of such lead complexes are alkyl-substituted β-diketonato complexes, such as bis(acetylacetonato)lead, bis(hexane-2,4-dionato)lead, bis(5-methylhexane-2,4-dionato)lead, bis(heptane-2,4-dionato)lead, bis(2-methylheptane-3,5-dionato)lead, bis(5-methylheptane-2,4-dionato)lead, bis(6-methylheptane-2,4-dionato)lead, bis(2,2-dimethylheptane-3,5-dionato)lead, bis(2,2,6-trimethylheptane-3,5-dionato)lead, bis(2,2,6,6-tetramethylheptane-3,5-dionato)lead, bis(octane-2,4-dionato)lead, bis(2,2,6-trimethyloctane-3,5-dionato)lead, bis(2,6-dimethyloctane-3,5-dionato)lead, bis(2-methyl-6-ethyldecane-3,5-dionato)lead, and bis(2,2-dimethyl-6-ethyldecane-3,5-dionato)lead; fluorine-substituted alkyl β-diketonato complexes, such as bis(1,1,1-trifluoropentane-2,4-dionato)lead, bis(1,1,1-trifluoro-5,5-dimethylhexane-2,4-dionato)lead, bis(1,1,1,5,5,5-hexafluoropentane-2,4-dionato)lead, and bis(1,3-diperfluorohexylpropane-1,3-dionato)lead; and ether-substituted β-diketonato complexes, such as bis(1,1,5,5-tetramethyl-1-methoxyhexane-2,4-dionato)lead, bis(2,2,6,6-tetramethyl-1-methoxyheptane-3,5-dionato)lead, and bis(2,2,6,6-tetramethyl-1-(2-methoxyethoxy)heptane-3,5-dionato)lead.

The titanium compounds (I) wherein M is a titanium atom are compounds composed of titanium and a β-diketone compound and/or a glycol compound and/or an alcohol. Those in which m is 2 are preferred for their chemical stability. Compound Nos. 1 to 10 shown below are particularly preferred.

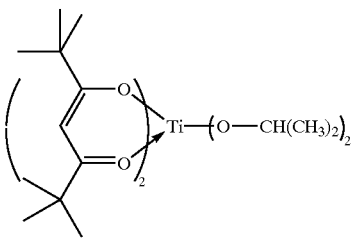

Compound No. 1

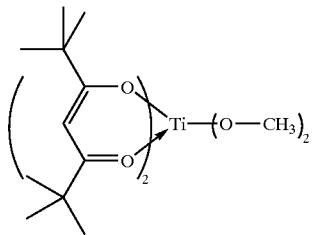

Compound No. 2

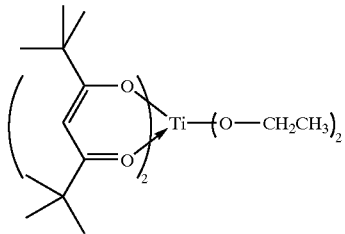

Compound No. 3

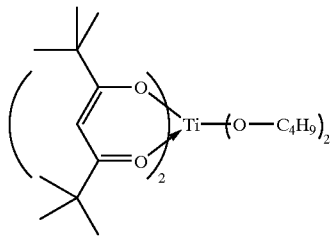

Compound No. 4

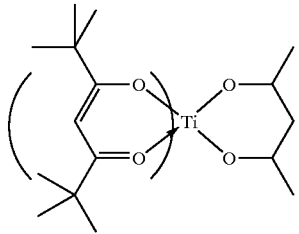

Compound No. 5

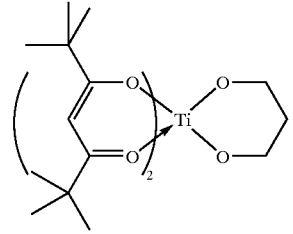

Compound No. 6

Compound No. 7

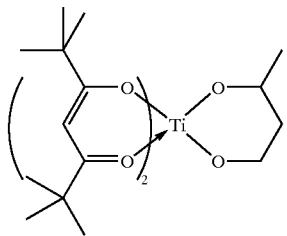

Compound No. 8

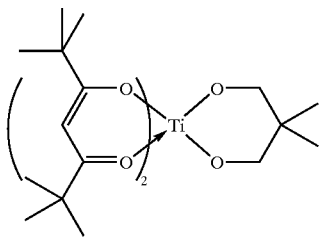

Compound No. 9

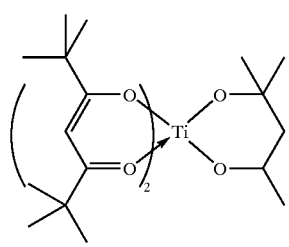

Compound No. 10

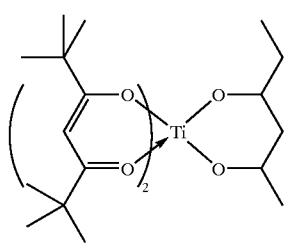

The zirconium compounds (I) in which M is a zirconium atom are compounds composed of zirconium and a β-diketone compound and/or a glycol compound and/or an alcohol. Those in which m is 2 or 4 are preferred for their chemical stability. Compound Nos. 11 to 22 shown below are particularly preferred.

Compound No. 11

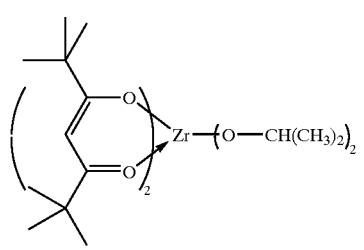

Compound No. 12

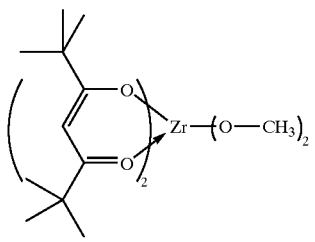

Compound No. 13

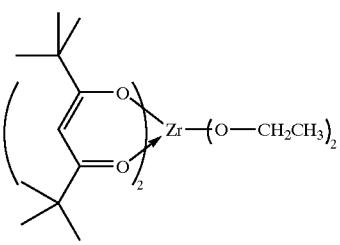

Compound No. 14

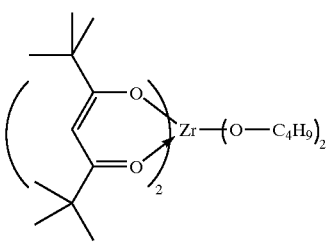

Compound No. 15

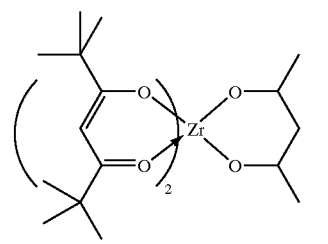

Compound No. 16

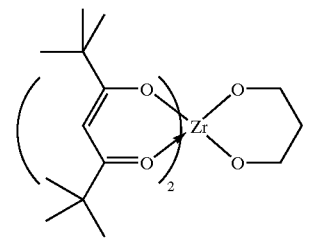

Compound No. 17

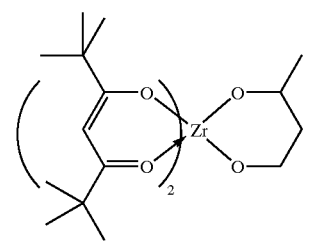

-continued

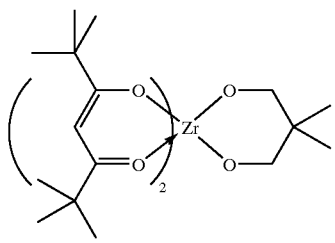

Compound No. 18

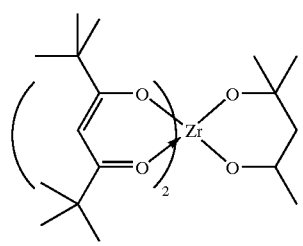

Compound No. 19

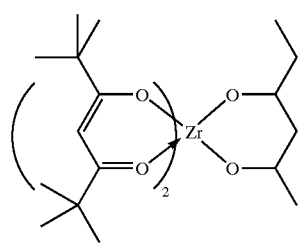

Compound No. 20

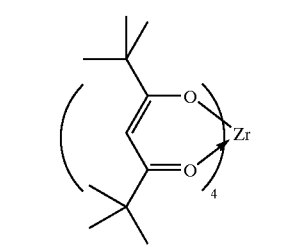

Compound No. 21

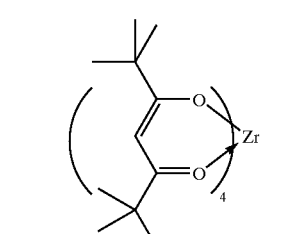

Compound No. 22

H₃COH₄C₂O

The metal compounds (I) including the above-enumerated specific examples of lead, titanium or zirconium compounds can be prepared from a salt or lower alkoxide of the metal and a ligand compound, i.e., a β-diketone compound, a glycol compound or an alcohol compound, in a well-known manner. For example, the lead compounds are easily obtained by the reaction between lead chloride, lead nitrate, lead acetate or lead monoxide and a β-diketone or a β-diketonatosodium. The titanium or zirconium compounds are easily obtained by the reaction between a tetrachloride or lower alkoxide of the metal and a ligand compound.

In the cyclohexane compound (II) which can be used in the present invention as a solvent, the alkyl group having 1 to 4 carbon atoms as represented by $R_5$ includes methyl, ethyl, propyl, isopropyl, butyl, isobutyl, sec-butyl, and t-butyl. Examples of the cyclohexane compound (II) are cyclohexane, methylcyclohexane, ethylcyclohexane, propylcyclohexane, isopropylcyclohexane, butylcyclohexane, sec-butylcyclohexane, isobutylcyclohexane, t-butylcyclohexane, 1,2-dimethylcyclohexane, 1,3-dimethylcyclohexane, 1,4-dimethylcyclohexane, 1,2-diethylcyclohexane, 1,3-diethylcyclohexane, 1,4-dibutylcyclohexane, 1-ethyl-2-methylcyclohexane, 1-isopropyl-2-methylcyclohexane, and 1-propyl-3-isobutylcyclohexane. Preferred of them are cyclohexane and methylcyclohexane for their availability.

The above-mentioned cyclohexane compounds are solvents capable of dissolving the metal compound to provide a stable solution of the metal compound in an adequate concentration as shown in Tables 1 to 4 below. In particular, they provide lead compound solutions with satisfactory physical properties as a CVD material.

TABLE 1

| Solubility[1] of Pd Compound (mol/l; 20° C.) | | |
|---|---|---|
| | Pb(THD)₂[2] | Pb(METHD)₂[3] |
| Cyclohexane | >0.5 | >0.5 |
| Methylcyclohexane | >0.5 | >0.5 |
| Isopropyl alcohol | ≧0.15, <0.20 | >0.5 |
| Butyl acetate | >0.5 | >0.5 |
| Tetrahydrofuran | ≧0.15, <0.20 | >0.5 |
| Diethylene glycol dimethyl ether (diglyme) | ≧0.15, <0.20 | >0.5 |
| Octane | ≧0.3, <0.35 | ≧0.20, <0.25 |

Note:
[1]: Solubility is expressed stepwise at a concentration interval of 0.05 mol/l (hereinafter the same)
[2]: Bis(2,2,6,6-tetramethyl-heptane-3,5-dionato)lead (hereinafter the same)
[3]: Bis(2,2,6,6-tetramethyl-1-(2-methoxy-ethoxy)heptane-3,5-dionato)lead (hereinafter the same)

TABLE 2

| Stability* of Pb Compound (concn.: 0.10 mol/l; on 10-day standing) | | | |
|---|---|---|---|
| | Pb(THD)₂ | Pb(METHD)₂ | Pb(FPD)₂** |
| Cyclohexane | good | good | good |
| Methylcyclohexane | good | good | good |
| Isopropyl alcohol | poor | poor | poor |
| Butyl acetate | poor | poor | poor |
| Tetrahydrofuran | poor | poor | poor |
| Diglyme | poor | poor | poor |
| Octane | good | good | good |

Note:
*: The solution which remained as clear as it had been immediately after the preparation was rated "good", and the solution which suffered from precipitation was rated "poor" (hereinafter the same).
**: Bis(1,1,1,5,5,5-hexafluoropentane-2,4-dionate)lead

TABLE 3

Solubility (mol/l; 20° C.) and
Stability (concn.: 0.10 mol/l; on 10-day standing) of Ti Compound

| Solvent | Compound No. 1 | | Compound No. 9 | |
|---|---|---|---|---|
| | Solubility | Stability | Solubility | Stability |
| Cyclohexane | >0.50 | good | >0.50 | good |
| Methyl-cyclohexane | >0.50 | good | >0.50 | good |

TABLE 4

Solubility (mol/l; 20° C.) and
Stability (concn.: 0.10 mol/l; on 10-day standing) of Zr Compound

| | Compound No. 14 | | Compound No. 19 | | Compound No. 21 | |
|---|---|---|---|---|---|---|
| Solvent | Solubility | Stability | Solubility | Stability | Solubility | Stability |
| Cyclohexane | >0.50 | good | >0.50 | good | >0.50 | good |
| Methyl-cyclohexane | >0.50 | good | >0.50 | good | >0.50 | good |

The metal compound solution and the CVD material comprising the solution according to the present invention are not particularly limited in terms of concentration and can have any concentration selected according to the delivery of the CVD material, the deposition rate in film formation, and the like as long as the solution can be supplied in a stable manner. A preferred concentration range is from 0.05 to 0.5 mol/l. At concentrations lower than 0.05 mol/l, the supply of the metal source tends to be insufficient, resulting in a reduced deposition rate. At concentrations exceeding 0.5 mol/l, the CVD material has reduced flowability or tends to cause disorders such as precipitation.

The lead titanate-based thin film produced in the present invention includes thin films of lead titanate, lead zirconate titanate, and lead lanthanum zirconate titanate, with a lead zirconate titanate thin film being preferred in terms of electrical characteristics and controllability in film formation.

The process of producing a lead titanate-based thin film according to the present invention is characterized by using the above-mentioned metal compound solution as a raw material. Otherwise the known techniques are applied as for the manner of feeding the raw material, the film formation conditions and the like.

Where the intended thin film is of multi-component system, a plurality of CVD materials may be fed separately and mixed up at the time of film deposition (hereinafter also called "a multi-bottle process"), or they may be mixed at a predetermined ratio and fed as a mixture (hereinafter also called "one-bottle process").

The CVD technique which can be used to form the lead titanate-based thin film is not particularly limited as long as it is carried out with general CVD apparatus, including thermal CVD, plasma enhanced CVD, and photo assisted CVD.

In thermal CVD, for instance, the material is vaporized, introduced onto a substrate, and decomposed on the substrate to deposit a thin film on the substrate. In order to prevent the material from decomposition in the vaporization step, the material is preferably vaporized under reduced pressure of 13330 Pa or less, particularly 8000 Pa or less, at or below the decomposition temperature. It is preferred that the substrate be preheated to or above the decomposition temperature of the CVD material, preferably 350° C. or higher, still preferably 450° C. or higher. If desired, the resulting thin film can be subjected to annealing.

In carrying out film formation by CVD, a nucleophilic reagent is sometimes used as a stabilizer for the metal compound (metallic element source) and/or the solution thereof. Since the metal compound solution of the present invention has sufficient stability, such a stabilizer is not always necessary but can be added, if desired. Stabilizers useful in the present invention include ethylene glycol ethers, such as glyme, diglyme, triglyme and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, $N_3N'$-tetramethylethylenediamine, diethylenetriamine, triethylenetetramine, tetraethylenepentamine, pentaethylenehexamine, 1,1,4,7,7-pentamethyldiethylenetriamine, and 1,1,4,7,10,10-hexamethyltriethylenetetramine; cyclic polyamines such as cyclam and cylene; and β-ketoesters or β-diketones, such as methyl acetoacetate, ethyl acetoacetate, and 2-methoxyethyl acetoacetate.

The stabilizer can be used in an amount of 0.1 to 10 mol, preferably 1 to 4 mol, per mole of the metal compound.

The present invention will now be illustrated in greater detail with reference to Preparation Examples and Examples, but it should be understood that the invention is not construed as being limited thereto.

Preparation Example 1

Preparation of Raw Materials

Cyclohexane and methylcyclohexane were each dried over metallic sodium wire and purified by distillation by cutting the initial 10 wt % distillate and a 10 wt % residue. CVD materials described below were prepared by dissolving a metal compound in the thus purified solvent in an argon stream.

| Designation | Metal compound | Solvent | Concentration (mol/l) |
|---|---|---|---|
| (1) Lead material | | | |
| P-1 | bis(2,2,6,6-tetramethylheptane-3,5-dionato)lead | cyclohexane | 0.15 |
| P-2 | bis(2,2,6,6-tetramethylheptane-3,5-dionato)lead | methyl-cyclohexane | 0.15 |
| P-3 | bis(2,2,6,6-tetramethyl-1-(2-methoxyethoxy)heptane-3,5-dionato)lead | methyl-cyclohexane | 0.20 |
| (2) Titanium material | | | |
| T-1 | Compound No. 1 | cyclohexane | 0.15 |
| T-2 | " | methyl-cyclohexane | 0.15 |
| T-3 | Compound No. 9 | methyl-cyclohexane | 0.20 |
| (3) Zirconium material | | | |
| Z-1 | Compound No. 19 | cyclohexane | 0.15 |
| Z-2 | Compound No. 21 | methyl-cyclohexane | 0.15 |
| Z-3 | Compound No. 22 | methyl-cyclohexane | 0.20 |

EXAMPLE 1

Production of PZT Thin Film (Multi-bottle Process)

A lead zirconate titanate thin film was formed on a silicon wafer by use of the CVD apparatus shown in FIG. 1 under conditions described below.

CVD Conditions
 CVD material: P-1, T-1 and Z-1
 Vaporization chamber temperature: 200° C.
 Flow rate of CVD material:
  P-1: 0.11 ml/min
  T-1: 0.05 ml/min
  Z-1: 0.05 ml/min
 Oxygen gas flow rate: 470 sccm
 Reaction pressure: 2700 Pa
 Reaction time: 15 min.
 Substrate temperature: 600° C.

The resulting thin film was analyzed by X-ray diffractometry to see the peak assigned to lead zirconate titanate. Further, the film was stripped, by soaking in a 5% hydrofluoric acid aqueous solution, and the stripping liquid containing the film was analyzed in an ICP elemental analyzer to determine the film composition. The results obtained were as follows.

X-Ray diffractometry: The peak of PZT was observed.
 Compositional molar ratio: Pb/Ti/Zr=1.00/0.53/0.47

EXAMPLE 2

Production of PZT Thin Film (Multi-bottle Process)

A lead zirconate titanate thin film was formed on a silicon wafer by use of the CVD apparatus shown in FIG. 1 under conditions described below.

CVD Conditions
 CVD material: P-2, T-2 and Z-2
 Vaporization chamber temperature: 200° C.
 Flow rate of CVD material:
  P-1: 0.11 ml/min
  T-1: 0.05 ml/min
  Z-1: 0.05 ml/min
 Oxygen gas flow rate: 470 sccm
 Reaction pressure: 2700 Pa
 Reaction time: 15 min.
 Substrate temperature: 600° C.

The produced thin film was analyzed by X-ray diffractometry to see the peak assigned to lead zirconate titanate. The film was stripped by soaking in a 5% hydrofluoric acid aqueous solution, and the stripping liquid containing the film was analyzed in an ICP elemental analyzer to determine the film composition. The results obtained were as follows.

X-Ray diffractometry: The peak of PZT was observed.
 Compositional molar ratio: Pb/Ti/Zr=1.00/0.51/0.48

EXAMPLE 3

Production of PZT Film (One-bottle Process)

Figure 2:
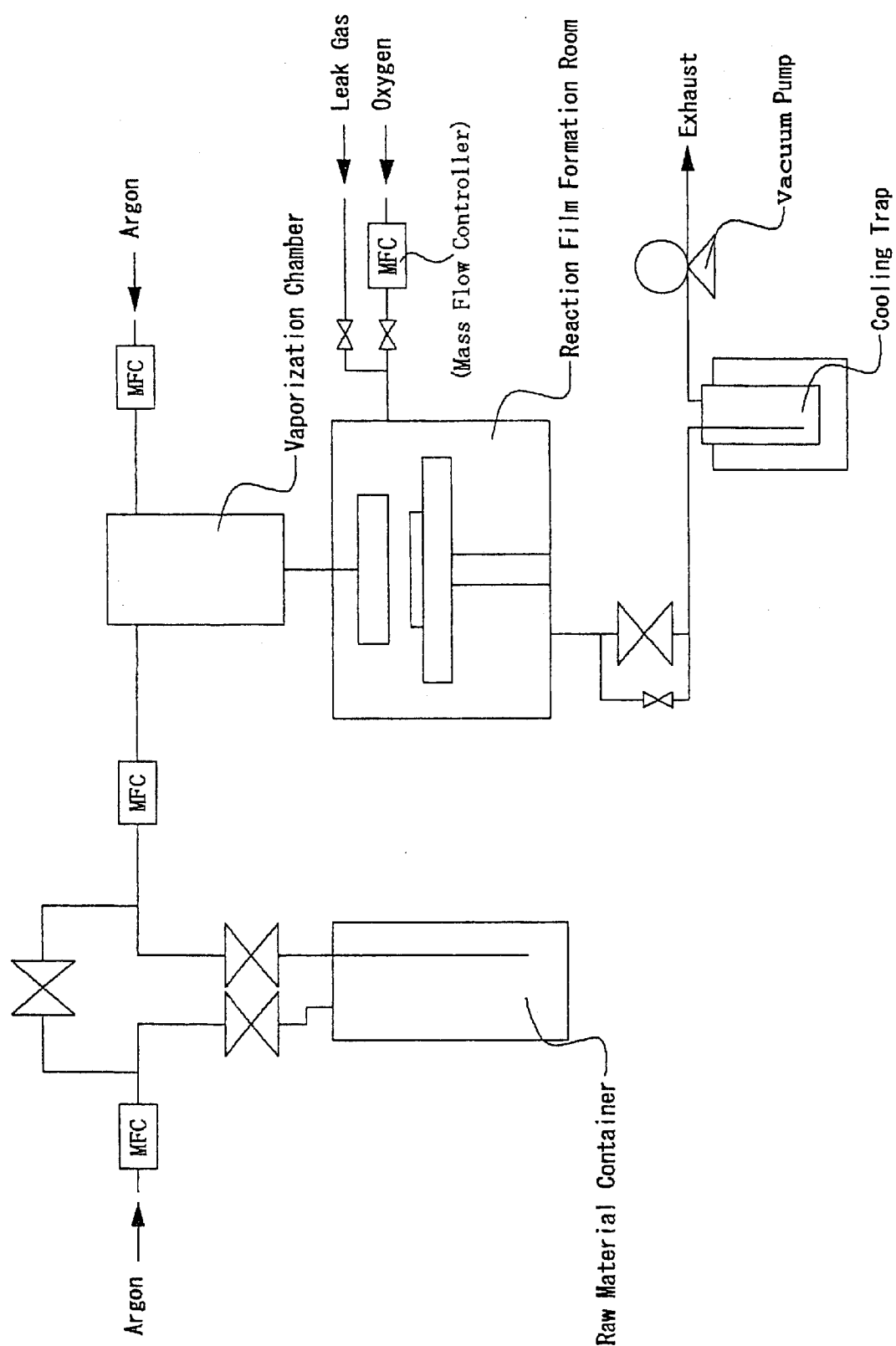
FIG. 2 schematically shows another example of a CVD apparatus used in the lead titanate-based thin film formation according to the present invention.

A lead zirconate titanate thin film was formed on a silicon wafer by use of the CVD apparatus shown in FIG. 2 under conditions described below.

CVD Conditions
 CVD material: a 2:1:1 (by volume) mixture of P-3, T-3 and Z-3
 Vaporization chamber temperature: 200° C.
 Flow rate of CVD material: 0.15 ml/min
 Oxygen gas flow rate: 400 sccm
 Reaction pressure: 2700 Pa
 Reaction time: 15 min.
 Substrate temperature: 600° C.

The produced thin film was analyzed by X-ray diffractometry to see the peak assigned to lead zirconate titanate. The film was stripped by soaking in a 5% hydrofluoric acid aqueous solution, and the stripping liquid containing the film was analyzed in an ICP elemental analyzer to determine the film composition. The results obtained were as follows.

X-Ray diffractometry: The peak of PZT was observed.
 Compositional molar ratio: Pb/Ti/Zr1.00/0.53/0.51

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A metal compound solution comprising a metal compound represented by formula (I):

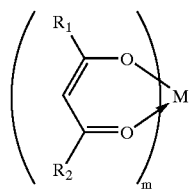 (I)

wherein $R_1$ and $R_2$ each represent a halogen-substituted or unsubstituted alkyl group having 1 to 8 carbon atoms which may contain an oxygen atom in its carbon chain; M represents a lead atom; m represents 2, said metal compound being dissolved in a cyclohexane compound represented by formula (II):

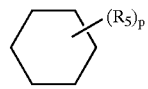 (II)

wherein $R_5$ represents a hydrogen atom or an alkyl group having 1 to 4 carbon atoms; p represents 1 or 2.

2. The metal compound solution according to claim 1, wherein $R_5$ is a hydrogen atom or a methyl group, and p is 1.

3. A material of chemical vapor deposition comprising the metal compound solution according to claim 1.

4. A process of producing a lead titanate-based thin film on a substrate comprising the steps of:

(a) providing a substrate;

(b) providing the material according to claim 3, (c) vaporizing the material;

(d) introducing the vaporized material onto the substrate; and (e) decomposing the vaporized material to deposit the thin film on the substrate.

5. The process according to claim 4, wherein said lead titanate-based thin film is a lead zirconate titanate thin film.

* * * * *